Jan. 7, 1964 L. N. DAMICO 3,117,287

TRANSISTOR ELECTRONIC ATTENUATORS

Filed Oct. 29, 1959

INVENTOR
LAWRENCE N. DAMICO
BY H. Vincent Harsha
ATTORNEY

United States Patent Office 3,117,287

Patented Jan. 7, 1964

3,117,287

TRANSISTOR ELECTRONIC ATTENUATORS

Lawrence N. Damico, East Boston, Mass., assignor to Raytheon Company, Lexington, Mass., a corporation of Delaware Filed Oct. 29, 1959, Ser. No. 849,616
7 Claims. (Cl. 330—86)

This invention relates to semiconductor electronic attenuator circuits and more particularly to a transistor electronic attenuator incorporating provisions for controlling the gain of an amplifier.

In amplifiers in which it is desired to utilize a rapid acting automatic gain control to vary amplifier gain, it is difficult to maintain a low distortion figure over a wide band of frequencies when a semiconductor device is used in the automatic gain control circuit. In particular, the inherent non-linearity of semiconductors increases the difficulties associated with providing distortion-free operation in transistor automatic gain control circuits in which the gain control voltage is used to vary amplifier gain rather than to effect a change in the input signal. Moreover, when an electronic attenuator is used as a voltage divider to vary the input signal to the amplifier, the quiescent direct current normally flowing during attenuator action introduces noise voltage into the amplifier input. It is therefore an object of the invention to provide a transistor automatic gain control circuit which is substantially free of noise and distortion even when used in connection with a wide band high gain amplifier.

In accordance with the transistor electronic attenuator of the invention, a resistor is connected in series with the input of an amplifier, the resistor forming the first leg of the voltage divider portion of an electronic attenuator. The collector and emitter electrodes of a transistor are connected across the amplifier input circuit to provide a variable resistance corresponding to the second leg of the voltage divider portion of the attenuator. A control signal is provided by rectifying the output of the amplifier by means of a diode. The rectified control signal is filtered to remove alternating current variations and the resulting direct current control signal is applied to the base of the transistor to vary the collector-to-emitter electrode impedance in response to the average value of the amplified output signal. In this manner, by varying only the input signal to the attenuator, bias voltages applied to the amplifier and amplifier gain remains constant. Thus, rapid automatic volume control action is achieved by means of a transistor control circuit without affecting amplifier gain and without producing distortion in the amplifier output.

Figure 1:
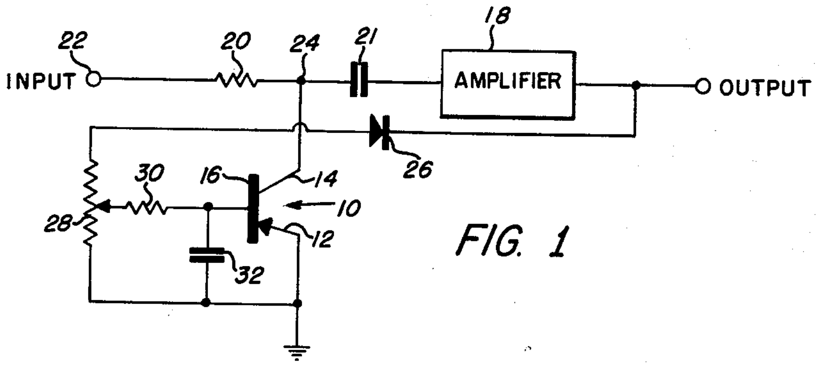
Figure 2:
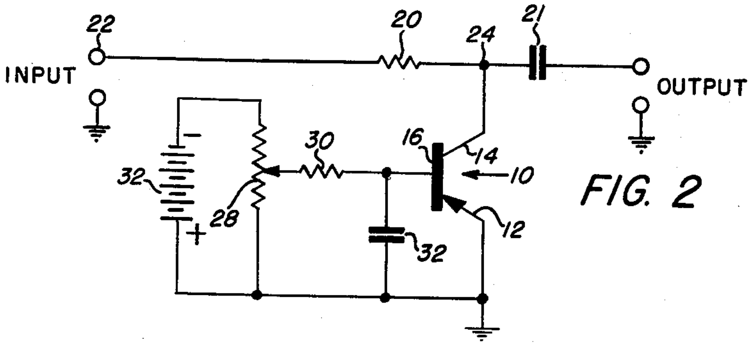

The foregoing and other objects of the invention will be best understood from the following description of exemplifications thereof, reference being had to the accompanying drawing wherein:

FIG. 1 is a schematic circuit diagram of a transistor electronic attenuator and automatic gain control system for an amplifier embodying the present invention; and FIG. 2 is a schematic circuit diagram of a transistor electronic attenuator adapted for operation in accordance with the invention.

Referring now to the drawing herein, like elements are designated by like reference numerals throughout the figures. Referring particularly to FIG. 1, a transistor 10 is provided with an emitter electrode 12, a collector electrode 14 and a base electrode 16. The transistor 10 is illustrated as being of the P-N-P junction type, although it should be understood that throughout the description the use of a P-N-P junction-type transistor is merely for the purpose of illustration and an N-P-N junction transistor may be used by reversing the polarity of the biasing potentials. The transistor is connected across the input of an amplifier 18 and forms one leg of a voltage divider. A resistor 20 is connected in series with the input of amplifier 18 by way of a coupling capacitor 21. The resistor 20 forms the other leg of the voltage divider. In this manner, by varying the transistor leg of the voltage divider in accordance with the output signal of amplifier 18, the amplitude of an input signal applied to input terminal 22 is made to vary at point 24 inversely as the output of the amplifier.

To achieve this operation, a portion of the output from amplifier 18 is rectified by diode 26 and is fed back by way of a level setting potentiometer 28 to an RC filter network comprising a resistor 30 and capacitor 32. This network filters out alternating current variations in the feedback voltage. The resulting filtered direct current control signal is then fed to the base electrode 16 of the transistor 10. In this manner, automatic gain control parent, which is the nearest related variety, the Red-action is achieved solely by varying the amplitude of the input signal to the amplifier, the gain of the amplifier remaining constant. The potentiometer 28 sets the desired amount of automatic gain control action. To prevent amplifier distortion during amplification of an alternating current input signal, both halves of the input signal are attenuated the same amount. This is achieved by the action of transistor 10 which permits the negative portion of the alternating current signal to flow from the collector to the emitter and to ground, and the positive portion of the alternating current signal to flow from the collector to the base and then through capacitor 32 to ground. During positive input signal swings, the collector-base diode portion of the transistor becomes forward biased, allowing a positive current to flow from collector to base. Attenuation during both half-cycles occurs by means of a gradual loading of the signal source. Since there is no quiescent current flow through the transistor, substantially no noise is generated by this circuit and distortion introduced at the input to the amplifier is substantially eliminated.

Referring to FIG. 2, a transistor electronic attenuator is adapted to provide a constant attenuation level for use in connection with a device in which it is desired to attenuate the input signal. For example, the potentiometer 28 can be calibrated to simulate a desired sensing voltage and thus to provide an automatic attenuation of an input signal in response to the sensing voltage. A battery 32 is connected to the potentiometer 28 to provide a direct current source of voltage for the base electrode 16. In particular applications where a direct current signal is to be attenuated, it is possible to omit the coupling capacitor 21. As noted, quiescent current does not flow through the transistor 10 as in the case of the usual electronic attenuator employing electron tubes connected in cascade. The quiescent current flowing through the cascade stage introduces noise into the output circuit. In particular, the potentiometer 28 of FIG. 2 is adjusted to apply a negative voltage from voltage source 32 to the base electrode of transistor 10. The amplitude of this negative voltage determines the amount of conduction of the transistor 10 and, thus, the attenuation of an input signal. As in the circuit shown in FIG. 1, control current flow is confined to the base-emitter circuit of the transistor and does not introduce noise into the input circuit.

This completes the description of the particular embodiments of the invention illustrated herein. However, many modifications thereof will be apparent to persons skilled in the art without departing from the spirit and scope of this invention. Accordingly, it is desired that this invention not be limited by the particular details described herein, except as defined by the appended claims.

What is claimed is:

1. In combination, an amplifier for amplifying an input signal having output and input terminals, a semiconductor device having an emitter electrode, a collector electrode and a base electrode, the emitter and collector electrodes of said device being connected in shunt with the input terminals of said amplifier, said input signal providing the only source of voltage applied to said collector whereby there is a substantially zero quiescent current flow in said semiconductor device, and a rectifier connected in circuit with the output of said amplifier and the base electrode of said semiconductor device.

2. An electronic attenuator circuit for attenuating an input signal comprising a semiconductor device having an emitter electrode, a collector electrode and a base electrode, wherein the input signal applies the only source of voltage applied to said collector whereby there is a substantially zero quiescent current flow in said semiconductor device, an amplifier having input terminals, a resistor connected in series with one of said input terminals of said amplifier, the collector and emitter of said semiconductor device connected across said input terminals, the collector of said semiconductor device being connected to the junction of said resistor and one of said input terminals, and a rectifier connected in circuit with the output of said amplifier and the base electrode of said semiconductor device.

3. An electronic attenuator circuit for an amplifier, an input terminal, said attenuator circuit including a semiconductor device, said semiconductor device having an emitter electrode, a collector electrode and a base electrode, the emitter and collector electrodes of said semiconductor device being connected in shunt with the input of said amplifier, said amplifier output supplying the only source of D.C. bias for said semiconductor device so that there is a substantially zero quiescent current flow therethrough, means connecting a resistor in series with the collector electrode of said semiconductor device and said input terminal to provide a voltage divider in connection with the impedance of said semiconductor device, and means in the absence of quiescent current flow for varying the collector electrode-to-emitter electrode impedance of said semiconductor device in response to the output from said amplifier.

4. An electronic attenuator circuit for an amplifier, the combination comprising an amplifier, a semiconductor device having an emitter, a collector, and a base electrode, the emitter and collector electrodes of said semiconductor device being connected in shunt with the input of said amplifier, said amplifier output supplying the only source of D.C. bias for said semiconductor device, and a feedback circuit including a rectifier connected in circuit with the base electrode and said amplifier for providing a feedback voltage for varying in the absence of quiescent current flow the collector electrode-to-emitter electrode impedance of said semiconductor device in response to the output of said amplifier.

5. An electronic attenuator for attenuating an input signal comprising an input terminal and a common input and output terminal, a semiconductor device having an emitter, collector, and a base electrode, said input signal supplying the only source of voltage applied to said collector whereby there is a substantially zero quiescent current flow in said semiconductor device, a resistor connected in series with said collector electrode and said input terminal, said emitter electrode connected to said common input and output terminal, an output terminal connected to the output junction of said resistor and said collector electrode, a control voltage source for varying the collector-to-emitter electrode impedance of said semiconductor device, and a filter unit connected in series with said control voltage source and the base electrode of said semiconductor device.

6. In combination, a semiconductor device for attenuating an input signal having a base, a collector and an emitter electrode, a source of operating bias for biasing only said base and emitter electrodes, said input terminals connected to a signal to be attenuated, and a resistor connected in series with said collector and emitter electrodes and said input terminals, said input signals supplying the only source of voltage for said collector thereby providing a substantially zero quiescent current flow in said semiconductor device, said bias source varying the collector-to-emitter electrode impedance.

7. An electronic attenuator comprising a semiconductor device having a base, a collector and an emitter electrode, a source of operating bias for biasing only said base and emitter electrodes, input terminals connected to a signal to be attenuated, a resistor connected in series with said collector and emitter electrodes and said input terminals, said input signal supplying the only source of voltage to said collector, thereby providing substantially zero quiescent current flow in the presence of a signal, and means including said bias source for varying the collector-to-emitter electrode impedance.

References Cited in the file of this patent

UNITED STATES PATENTS

| | | |
|---|---|---|
| 2,544,211 | Barton | Mar. 6, 1951 |
| 2,801,300 | Crane et al. | July 30, 1957 |
| 2,847,519 | Aronson | Aug. 12, 1958 |
| 2,902,548 | Moeller | Sept. 1, 1959 |
| 2,914,622 | Jacobsen | Nov. 24, 1959 |